(12) United States Patent
Murosawa et al.

(10) Patent No.: US 7,234,215 B2
(45) Date of Patent: Jun. 26, 2007

(54) STACKING METHOD OF GREEN SHEET AND A MANUFACTURING METHOD OF MULTILAYER CERAMIC ELECTRONIC DEVICE

(75) Inventors: Syogo Murosawa, Chuo-ku (JP); Shigeki Satou, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/560,856

(22) PCT Filed: Jun. 17, 2004

(86) PCT No.: PCT/JP2004/008530

§ 371 (c)(1),
(2), (4) Date: Dec. 15, 2005

(87) PCT Pub. No.: WO2005/004182

PCT Pub. Date: Jan. 13, 2005

(65) Prior Publication Data

US 2006/0130320 A1    Jun. 22, 2006

(30) Foreign Application Priority Data

Jun. 20, 2003    (JP)  ............................. 2003-176546

(51) Int. Cl.
  *H01G 7/00*    (2006.01)
  *H01G 4/06*    (2006.01)
(52) U.S. Cl. .................... 29/25.42; 29/829; 29/830; 29/831; 361/321.2
(58) Field of Classification Search ............... 29/25.42, 29/829, 830, 831; 361/303, 306.1, 306.3, 361/321, 321.1, 321.2; 419/10, 61; 156/89.11, 156/89.12, 289
See application file for complete search history.

(56) References Cited

U.S. PATENT DOCUMENTS 4,297,522 A * 10/1981 Jesse et al. .................. 174/27
4,556,757 A * 12/1985 Oberbach ................... 174/384
6,245,171 B1 * 6/2001 Natarajan et al. ........ 156/89.11
6,550,117 B1    4/2003 Tokuoka et al.

FOREIGN PATENT DOCUMENTS

| EP | 0 923 094 A2 | 6/1999 |
| JP | A 08-062837 | 3/1996 |
| JP | A 11-067577 | 3/1999 |
| JP | A 11-238646 | 8/1999 |
| JP | A 2001-044064 | 2/2001 |
| JP | 2003-095740 | * 10/2004 |

* cited by examiner

*Primary Examiner*—A. Dexter Tugbang
*Assistant Examiner*—Tai Van Nguyen
(74) *Attorney, Agent, or Firm*—Oliff & Berridge, PLC

(57) ABSTRACT

A method of stacking a green sheet, where, in rolling up a support sheet on which a multilayer unit including a green sheet and/or electrode layer is formed, the multilayer unit can be easily unrolled without adhering to the back surface of the support sheet, and in stacking the multilayer unit, the support sheet can be easily separated from the multilayer unit. On the surface 20a of the support sheet 20 is stacked a multilayer unit U1 composed of an electrode layer 12a and/or green sheet 10a to form the support sheet with the laminated unit. Then, the support sheet 20 with the laminated unit is rolled up to form a rolled body R. The rolled body R is unrolled, the support sheet 20 with the multilayer unit is placed on a layer on which the support sheet is to be placed, the support sheet 20 is separated from the laminated unit U1, and the laminated unit U1 is stacked. On the back surface 20b of the support sheet 20 is applied separation-facilitating surface treatment with a width equal to or greater than the width of the multilayer unit U1, and an adhereable portion 23 where the separation-facilitating surface treatment is not applied is also formed on the back face 20b.

10 Claims, 11 Drawing Sheets

STACKING METHOD OF GREEN SHEET AND A MANUFACTURING METHOD OF MULTILAYER CERAMIC ELECTRONIC DEVICE

BACKGROUND OF THE INVENTION

1. Field of the Invention

The present invention relates to a stacking method of green sheets and manufacturing method of multilayer ceramic electronic device, and particularly relates to a method such as to efficiently bond and transfer electrode on a surface of dielectric green sheet or so.

2. Description of the Related Art

To manufacture multilayer ceramic electronic device such as multilayer ceramic capacitor or so, ceramic paste made by ceramic powder, a binder (an acrylic based resin and a butyral resin, etc.), a plasticizer (phthalate ester, glycols, adipic acid, phosphate ester, etc.), and an organic solvent (toluene, MEK, and acetone, etc.) are normally prepared first. Next, the ceramic paste is applied to a support sheet (PET, PP, etc.) by using the doctor blade method, etc., dried by heating, and PET film was released to obtain ceramic green sheet. Then, an internal electrode was printed on the ceramic green sheet and dried, then a plurality of the results are stacked and cut to be a chip shape, so that a green chip is obtained. Then, after firing the green chip, an external electrode is formed, and electronic device such as multilayer ceramic capacitor is manufactured.

However, in the case of printing the internal electrode paste on an extremely thin green sheet, there is a disadvantage that a binder component in the green sheet is dissolved or swollen due to a solvent in the internal electrode paste. Also, there is a disadvantage that an internal electrode paste soaks in the green sheet. These disadvantages may cause a short-circuiting defect.

Therefore, a dry type electrode transferring method is proposed wherein forming an electrode on support sheet other than green sheet, then, bonding and transferring the same on the green sheet. Further, in order to easily release electrode from the support sheet, a method wherein previously forming a release layer on a support sheet then, forming electrode on the same is proposed. Also, in order to satisfactorily bond green sheet and electrode, a method, wherein previously bonding and transferring a bond layer on the green sheet or the electrode, is proposed.

However, when a bond layer is continuously transferred on an electrode or a green sheet and said layer is rolled up, due to an adhesiveness of the bond layer on the surface of electrode or green sheet, a problem that the bond layer sticks to a back surface of support sheet may occur. Further, by providing a separation-facilitating surface treatment on both surfaces of the support sheet, adhesiveness can be suppressed; however, this may cause difficulty to hold the support sheet when releasing the same. And this may also cause a slipping between a support sheet and a roll, which is to move the support sheet, when the support sheet is moving.

DISCLOSURE OF THE INVENTION

The present invention was made in consideration of the above circumstances and has an object thereof to provide a stacking method of a green sheet, wherein in rolling up a support sheet on which multilayer unit comprising green sheet and/or electrode layer is formed, the multilayer unit can be easily unrolled without adhering to the back surface of the support sheet, and in stacking the multilayer unit, the support sheet can be easily separated from the multilayer unit. Further object of the present invention is to provide a method to easily and efficiently manufacture multilayer ceramic electronic device by using the stacking method of green sheet.

In order to achieve the abovementioned object, a stacking method of green sheet according to the present invention comprises the steps of;

forming a support sheet with multilayer units by stacking the staking unit that comprises electrode layer and/or green sheet on a surface of the support sheet, forming a roll body by rolling up the support sheet with the multilayer unit, and stacking the multilayer units by unrolling the roll body, placing the support sheet with multilayer unit on a layer which the support sheet is to be placed, and separating the support sheet from the multilayer unit, wherein, a separation-facilitating surface treatment with a width equal to or greater than the width of the multilayer unit is formed on the back surface of the support sheet and an adhesive part where the separation-facilitating surface treatment is not provided is also formed.

Method of the present invention is particularly useful when stacking a bond layer on a surface of the multilayer unit. Namely, in case forming an adhesive layer such as bond layer on a surface of multilayer unit, with the conventional method, a surface of the multilayer unit stick to a back surface of the support sheet when rolling up the support sheet forming multilayer unit. Accordingly, separation-facilitating surface treatment may be provided to the entire back surface of the support sheet. However, with this conventional method, when stacking the multilayer unit, it becomes difficult to separate support sheet from the multilayer unit. The reason for this will be described below. When separating support sheet from the multilayer unit, it is convenient to separate the support sheet by sticking an adhesive tape on the back surface of the support sheet. However, when a separation-facilitating surface treatment is provided on the back surface of support sheet, an adhesive tape does not adhere to the back surface of the support sheet and releasing the support sheet cannot efficiently be provided.

In the invention, due to adhesive parts existing at back surface of support sheet, a device to help separating such as adhesive tape (adhesive sheet) can easily be fitted to the back surface. Accordingly, when separating support sheet from multilayer unit, adhesive tape is stuck to the back surface of support sheet and the support sheet can easily be seaparated, and an attempt to efficiently stack the multilayer unit U1 can be made.

According to the method of the invention, a separation-facilitating surface treatment with a width equal to or greater than the width of the multilayer unit is provided. Accordingly, when rolling up the support sheet with multilayer unit and forming a roll body, a surface of multilayer unit does not stick to back surface of support sheet. Accordingly, when unrolling the roll body, inconveniences such as lacking the outer surface layer of multilayer unit do not occur. Therefore, the method according to the invention can well stack (including transferring and bonding) the multilayer unit, and contributes to making green sheets and/or electrode layers thin and increasing a number of the stacking dielectric layer and/or internal electrode layer.

Note that in the present invention, "a separation-facilitating surface treatment" is a surface treatment by which the multilayer unit is easily separated from the surface or back surface of the support sheet and silicone treatment, alkyd resin treatment, and melamine resin treatment or so is exemplified. Support sheet is not particularly limited, but PET or so is exemplified.

Preferably, the adhesive part is successively or intermittently formed along a longitudinal direction of support sheet. The adhesive part is a part where a device to help separating, such as adhesive tape, is bonded. The adhesive part is preferably formed successively along a longitudinal direction of support sheet but can be formed intermittently.

Preferably, a part where a separation-facilitating surface treatment is provided is successively formed along longitudinal direction on a back surface of the support sheet. This is because, when support sheet with multilayer unit is rolled up, a surface of multilayer unit continuously attach to a back surface of support sheet.

Preferably, the adhesive parts are formed on the back surface of support sheet at one side or both sides of support sheet in the width direction. A device to help separating, such as adhesive tape, may bond to support sheet even when adhesive part is only formed at one side of support sheet in the width direction. However, in order to provide a dependable bonding, adhesive parts are preferable to be formed at both sides of the support sheet.

Preferably, a separation-facilitating surface treatment is provided on the entire surface of the support sheet. Multilayer unit, which will be separated later, is formed on the surface of the support sheet, and that a device to help separating, such as adhesive tape, is not required. Note, on the surface of support sheet, a separation-facilitating surface treatment with a width equal to that of the back surface, can be provided, and an adhesive part can be provided at the remaining part.

Preferably, the roll body is unrolled, the support sheet with multilayer unit is cut, the support sheet with multilayer unit which is cut is placed on a layer where it is to be stacked, the support sheet is separated from the multilayer unit, and the multilayer unit is stacked. Multilayer unit may be stacked alone without cutting the support sheet with multilayer unit which was unrolled from the roll body, however, it is easy to stack after cutting the support sheet with multilayer unit.

Preferably, the multilayer unit comprises an electrode layer having predetermined pattern and a blank pattern layer formed in a blank part between the electrode layers having predetermined patterns. In order to eliminate a level difference due to the electrode layer, it is preferable to form blank pattern layer.

Manufacturing method of multilayer ceramic electronic device according to the present invention is characterized in that providing removing binder treatment and firing the multilayer body which is stacked by green sheet stacking method as mentioned above. By manufacturing multilayer ceramic electronic device using the stacking method of green sheet according to the present invention, making the dielectric layer and/or internal electrode layer thin, and increasing a number of the stacking dielectric layer and/or internal electrode layer can be easily realized.

BEST MODE FOR CARRYING OUT THE INVENTION

First, as an embodiment of an electronic device manufactured by a method according to the present invention, an overall configuration of a multilayer ceramic capacitor will be explained below.

Figure 1:
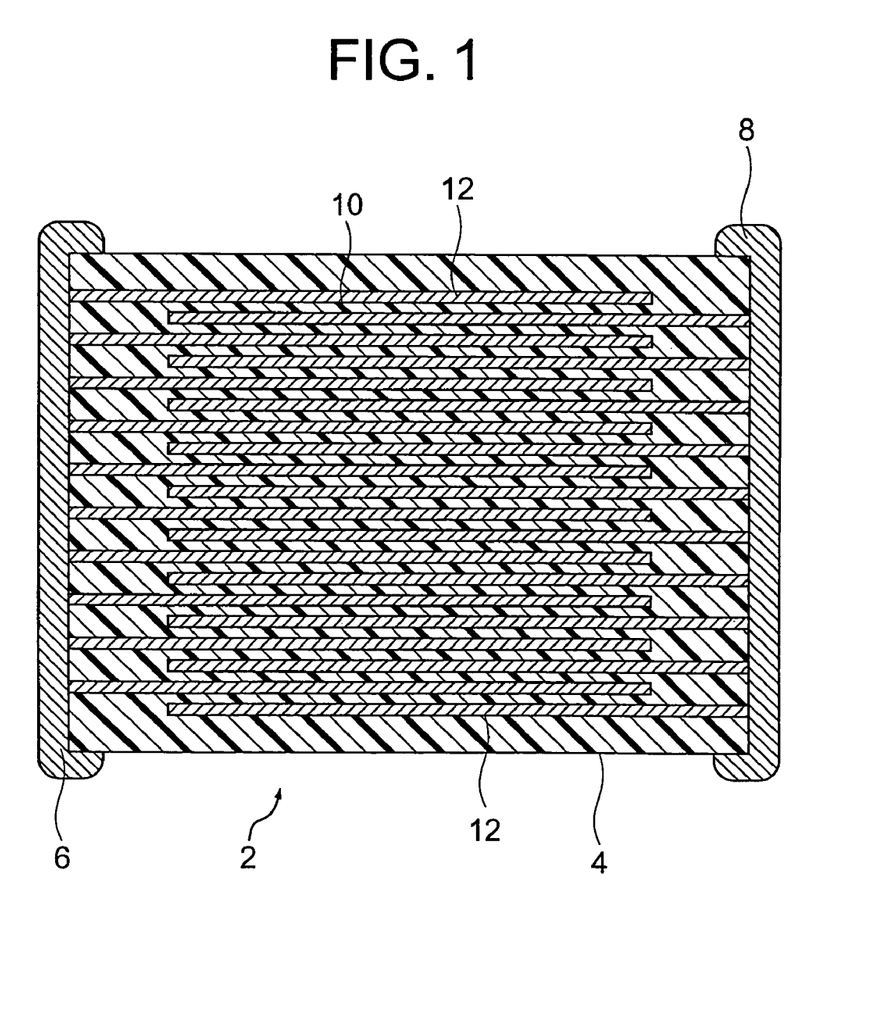
FIG. 1 is a schematic sectional view of a multilayer ceramic capacitor according to a manufacturing method of an embodiment of the present invention.

As shown in FIG. 1, a multilayer ceramic capacitor 2 according to the present embodiment comprises a capacitor element 4, a first terminal electrode 6 and a second terminal electrode 8. The capacitor element 4 has dielectric layers 10 and internal electrode layers 12, and the internal electrode layers 12 are alternately stacked between the dielectric layers 10. One side of the alternately stacked internal electrode layers 12 is electrically connected to inside the first terminal electrode 6 formed outside of a first end portion of the capacitor element body 4. Also, the other side of the alternately stacked internal electrode layers 12 is electrically connected to inside of the second terminal electrode 8 formed outside of a second end portion of the capacitor element body 4.

In the present embodiment, the internal electrode layer 12 is formed by transferring an electrode layer 12a to a ceramic green sheet 10a as shown in FIG. 2 to FIG. 12, which will be explained later on.

A material of the dielectric layer 10 is not particularly limited and formed by a dielectric material, such as calcium titanate, strontium titanate and/or barium titanate. A thickness of each dielectric layer 10 is not particularly limited but generally several μm to several hundreds of μ. Particularly, in the present embodiment, the layer is made thin as preferably 5 μm or less and more preferably 3 μm or less.

Also, a material of the terminal electrodes 6 and 8 is not particularly limited and normally copper, a copper alloy, nickel and nickel alloy, etc. are normally used and silver or silver alloy with palladium, etc. can be also used. Also, a thickness of the terminal electrodes 6 and 8 is not particularly limited and is normally 10 to 50 μm or so.

A shape and size of the multilayer ceramic capacitor 2 may be suitably determined in accordance with the use object. When the multilayer ceramic capacitor 2 is rectangular parallelepiped, it is normally a length (0.6 to 5.6 mm, preferably 0.6 to 3.2 mm)×width (0.3 to 5.0 mm, preferably 0.3 to 1.6 mm)×thickness (0.1 to 1.9 mm, preferably 0.3 to 1.6 mm) or so.

Next, an example of a manufacturing method of the multilayer ceramic capacitor 2 according to the present embodiment will be explained.

(1) First, a dielectric paste (paste for green sheet) is prepared to produce a ceramic green sheet to compose the dielectric layer 10 shown in FIG. 1 after firing.

The dielectric paste is normally composed of an organic solvent based paste obtained by kneading a dielectric material (ceramic powder) with an organic vehicle.

The dielectric material may be suitably selected from a variety of compounds to be a composite oxide or oxide, such as carbonate, nitrate, hydroxide and organic metal compound, and mixed to be used. The dielectric material is normally used as particles having an average particle diameter of 0.4 μm or less, preferably 0.1 to 3.0 μm or so. Note that it is preferable to use finer powder than a green sheet thickness to form an extremely thin green sheet.

The organic vehicle is obtained by dissolving a binder in an organic solvent. The binder used for the organic vehicle is not particularly limited and a variety of normal binders, such as ethyl cellulose, polyvinyl butyral, and an acrylic resin. Preferably, polyvinyl butyral and other butyral based resin are used.

Also, the organic solvent to be used for the organic vehicle is not particularly limited and an organic solvent, such as terpineol, alcohol, butyl carbitol, acetone and toluene, is used.

Preferably, the binder is previously dissolved and filtered in an alcohol solvent selected at least one kind or more from methanol, ethanol, propanol, and butanol to be a solution, and adding dielectric powder and the other component in the solution. Binder having a high degree of polymerization is difficult to dissolve in the solvent, and with a general method, dispersion of paste tends to deteriorate. According to a method of the present embodiment, binder having a high degree of polymerization is dissolved in the abovementioned feasible solvent to be a solution, then, ceramic powder and the other component are added to the solution. Therefore, paste dispersion can be improved and an occurrence of resin not dissolved in the solution can be prevented. By using solvents other than the abovementioned solvent, a solid condensation cannot be raised, and a change of lacquer viscosity over time tends to grow.

The dielectric paste may include additives selected from a variety of dispersants, antistatic agents, plasticizers, dielectrics, glass flits and insulators.

According to the present embodiment, it is not particularly limited but preferably, nonionic dispersants of polyethylene glycols are used for dispersants, and shows 5 to 6 values of hydrophilic and lipophilic balance (HLB). Dispersants are contained preferably by 0.5 to 1.5 parts by weight, and more preferably, 0.5 to 1.0 parts by weight, with respect to 100 parts by weight of ceramic powder.

According to the present embodiment, preferably dioctyl phthalate is used for plasticizer. Said dioctyl phthalate is contained by 40 to 70 parts by weight, more preferably 40 to 60 parts by weight with respect to 100 parts by weight of binder. Compared to the other plasticizer, dioctyl phthalate is preferable for both sheet strength and sheet elongation, and particularly preferable for its small releasing strength in order to easily release from a support sheet. Note when a content of the plasticizer is too small, sheet elongation tends to become small and flexuous characteristic tends to become small, while too large, the plasticizer bleeds out from the sheet and segregation of plasticizer toward said sheet is likely to occur and dispersion characteristic of the sheet tends to deteriorate.

Binder is preferably contained by 5 to 6.5 parts by weight with respect to 100 parts by weight of dielectric powder. When content of binder is too small, sheet strength tends to deteriorate together with stacking ability (bond strength when stacking), while too large, segregation of binder occurs and dispersant tends to deteriorate and sheet surface roughness tends to deteriorate.

It is preferable for the dielectric paste to include antistatic agent and said agent is an imidazoline based agent. The antistatic agent is preferably contained by 0.1 to 0.75 part by weight, more preferably 0.25 to 0.5 part by weight with respect to 100 parts by weight of ceramic powder. When amounts of antistatic agent included are too small, antistatic efficiency become small, while too large, sheet surface roughness and also sheet strength tend to be deteriorated. When antistatic efficiency is too small, it may cause inconveniences such that static electricity is likely to occur when separating carrier sheet 30 as support sheet from ceramic green sheet 10a causing wrinkles on the green sheet.

Figure 4:
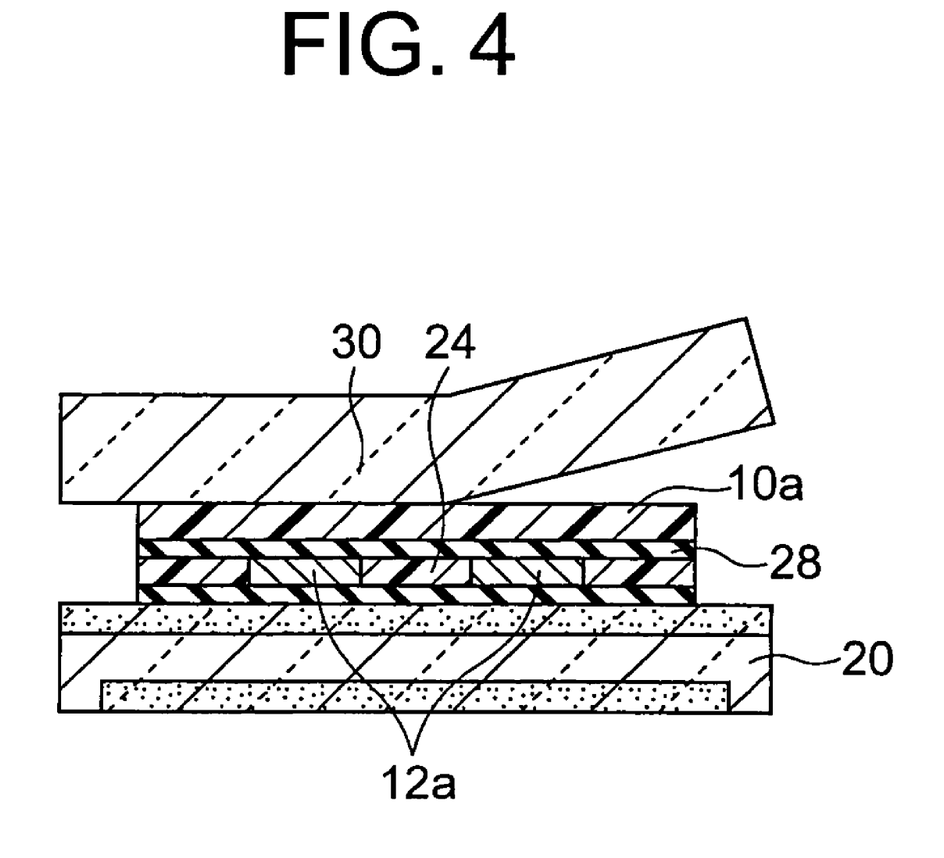
FIG. 4 is a sectional view of a key part showing a continuation step of FIG. 3.

By using the dielectric paste, a green sheet 10a is formed with a thickness of preferably 0.5 to 30 μm, and more preferably 0.5 to 10 μm or so on a carrier sheet 30 as a second support sheet as shown in FIG. 4 by the doctor blade method, etc. The green sheet 10a is dried after being formed on the carrier sheet 30. The drying temperature of the green sheet 10a is preferably 50 to 100° C. and the drying time is preferably 1 to 20 minutes. A thickness of the green sheet 10a after drying is reduced to 5 to 25% of a thickness before drying. The thickness of the green sheet 10a after drying is preferably 3 μm or less.

Figure 2A:
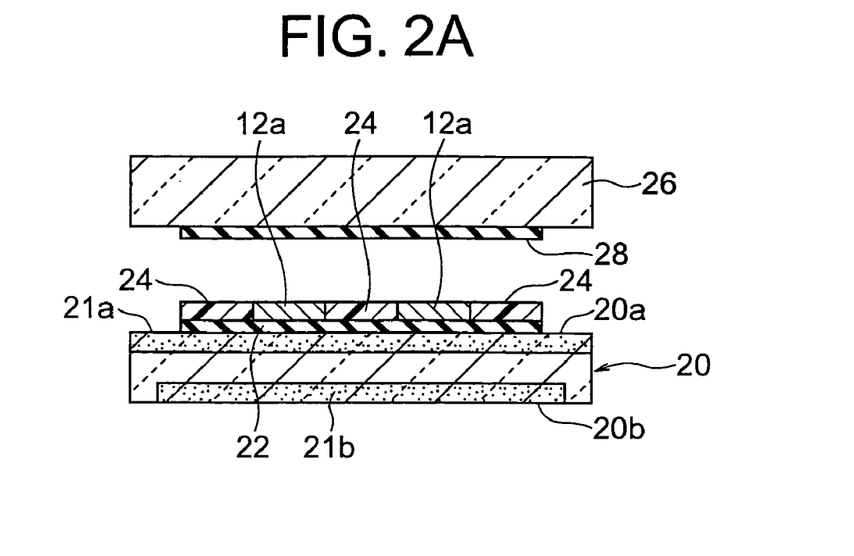
FIG. 2(A) is a sectional view of a key part showing a manufacturing method of a multilayer ceramic capacitor as in FIG. 1.
Figure 2B:
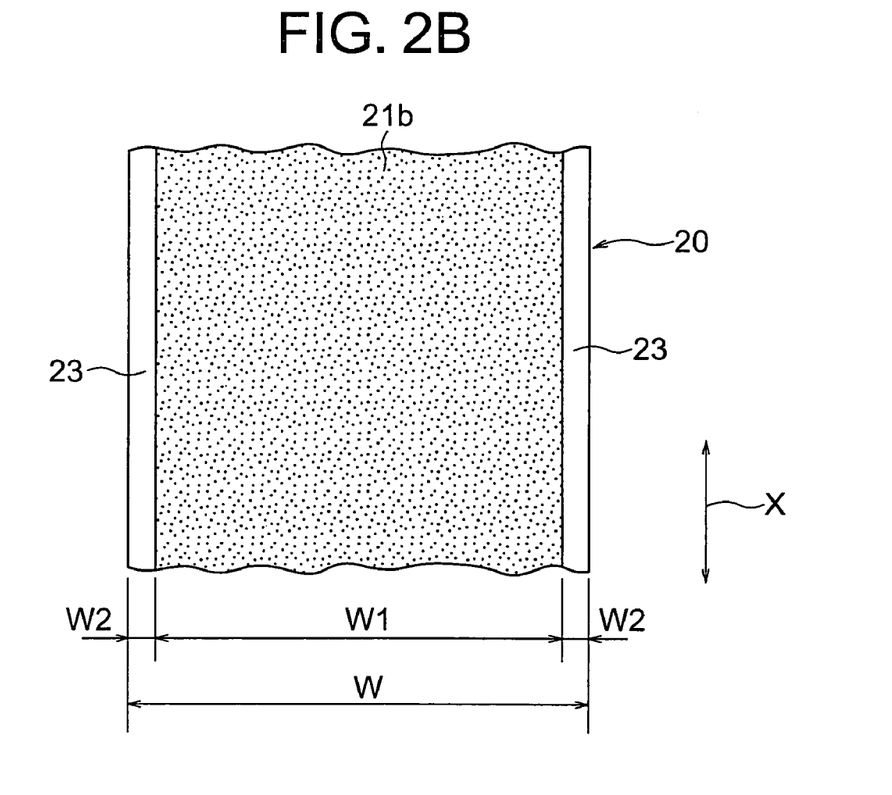
FIG. 2(B) is a back view of a key part showing a support sheet as in FIG. 2(A)

(2) A carrier sheet 20 as a first support sheet is prepared separately from the above carrier sheet 30 as shown in FIG. 2A, a release layer 22 is formed thereon, an electrode layer 12a having a predetermined pattern is formed thereon, and adjacent thereto, a blank pattern layer 24 having substantially the same thickness as that of the electrode layer 12a is formed on a surface of the release layer 22 where the electrode layer 12a is not formed.

As carrier sheets 20 and 30, PET film or so is used and in order to improve the easiness to separate said sheets from carrier sheets, it is preferable to provide a separation-facilitating surface treatment. Thickness of these carrier sheets 20 and 30 are not particularly limited but preferably 5 to 100 μm. The thickness of these carrier sheets 20 and 30 may be the same or different.

According to the present embodiment, as shown in FIG. 2(A), a separation-facilitating surface treatment is provided on a surface 20a of carrier sheet 20 as a first support sheet in order to improve the easiness to separate. A part where a separation-facilitating surface treatment is provided is called "full treatment part 21a". Electrode layer 12a and blank pattern layer 24 are formed on the surface of said full treatment part 21a. Note that a part where electrode layer 12a is not formed is determined to be back surface 20b of career sheet 20.

As a separation-facilitating surface treatment, methods of coating silicone, alkyd resin, or melamine resin on the surface of carrier sheet 20 are exemplified. "Partial treatment part 21b" where a separation-facilitating surface treatment is partially provided, and "adhesive part 23" where a separation-facilitating surface treatment is not provided, are formed on back surface 20b of carrier sheet 20. A width W1 of partial treatment part 21b shown in FIG. 2(B) with a width equal to or greater than the width of the electrode layer 12a and blank pattern layer 24, on the other, less than a width W of carrier sheet. And adhesive parts 23 where a separation-facilitating surface treatment is not provided are formed on both sides of partial treatment part 21*b*.

Width W2 of adhesive parts is preferably 3 to 30 mm, more preferably 5 to 10 mm. Note that, in the invention, one side of adhesive part 23 may not be formed. In the embodiment, full treatment part 21*a* and partial treatment part 21*b* are successively formed along a longitudinal direction X of carrier sheet 20. Further, adhesive parts 23 are also successively formed along a longitudinal direction X of carrier sheet 20.

The release layer 22 formed on a surface 21*a* of career sheet 20 preferably includes the same dielectric particles as that in the dielectrics composing the green sheet 10*a* shown in FIG. 4. Also, the release layer 22 includes a binder, plasticizer and release agent other than the dielectric particles. A particle diameter of the dielectric particles may be the same as that of the dielectric particles included in the green sheet, but is preferably smaller.

In the present embodiment, a thickness of the release layer 22 is preferably thinner than a thickness of the electrode layer 12*a* and is set to have a thickness of preferably 60% or less, and more preferably 30% or less with respect to a thickness of electrode layer.

A coating method of the release layer 22 is not particularly limited but the coating method using a wire bar coater or a die coater or so is preferable since it is necessary to make the coating extremely thin. Note that adjustment of the thickness of the release layer can be made by selecting a wire bar coater-having a different wire diameter. Namely, to make the thickness of the applying release layer thin, a smaller wire diameter can be selected, while to make it thick, larger wire diameter can be selected. The release layer 22 is dried after being applied. The drying temperature is preferably 50 to 100° C. and the drying time is preferably 1 to 10 minutes.

A binder for the release layer 22 is composed, for example, of an acrylic resin, polyvinyl butyral, polyvinyl acetal, polyvinyl alcohol, polyolefin, polyurethane, polystyrene, or an organic composed of a copolymer of these or emulsion. Plasticizers contained in the release layer 22 and in the green sheet 10*a* may be the same or different, however, they are preferably the same.

A plasticizer for the release layer 22 is not particularly limited and, for example, phthalate ester, phthalate dioctyl, adipic acid, phosphate ester and glycols, etc. may be mentioned. Plasticizers contained in the release layer 22 and in the green sheet 10*a* may be the same or different, however, they are preferably the same.

A release agent for the release layer 22 is not particularly limited and, for example, paraffin, wax and silicone oil, etc. may be mentioned. A release agent contained in the release layer 22 may be the same as that contained in the green sheet 10*a* or may be different from that.

A binder is contained in the release layer 22 by preferably 2.5 to 200 parts by weight, more preferably 5 to 30 parts by weight, and particularly preferably 8 to 30 parts by weight or so with respect to 100 parts by weight of dielectric particle.

A plasticizer is preferably contained in the release layer 22 by 0 to 200 parts by weight, preferably 20 to 200 parts by weight, and more preferably 50 to 100 parts by weight with respect to 100 parts by weight of the binder. Note that a content ratio of the plasticizer.

A release agent is preferably contained in the release layer 22 by 0 to 100 parts by weight, preferably 2 to 50 parts by weight, and more preferably 5 to 20 parts by weight with respect to 100 parts by weight of the binder.

After forming the release layer 22 on the surface of the carrier sheet 20, as shown in FIG. 2(A), an electrode layer 12*a* to compose an internal electrode layer 12 after firing is formed to be a predetermined pattern on the surface of the release layer 22. A thickness of the electrode layer 12*a* is preferably 0.1 to 2 μm, and more preferably 0.1 to 1.0 μm or so. The electrode layer 12*a* may be configured by a single layer or two or more layers having different compositions.

The electrode layer 12*a* can be formed on the surface of the release layer 22 by a thick film formation method, such as a printing method using an electrode paste, or a thin film method, such as evaporation and sputtering. When forming the electrode layer 12*a* on the surface of the release layer 22 by a screen printing method or a gravure printing method as a kind of thick film method, it is as follows.

First, an electrode paste is prepared. The electrode paste is fabricated by kneading a conductive material composed of a variety of conductive metals and alloys, or a variety of oxides, organic metal compounds or resinates, etc. to be conductive materials after firing, with an organic vehicle.

As a conductive material to be used when producing the electrode paste, Ni, a Ni alloy and a mixture of these are used. A shape of the conductive materials is not particularly limited and may be a spherical shape and scale-like shape, etc. or a mixture of these shapes. Those having an average particle diameter of the conductive material of normally 0.1 to 2 μm, and preferably 0.2 to 1 μm or so may be used.

An organic vehicle contains a binder and a solvent. As the binder, for example, ethyl cellulose, an acrylic resin, polyvinyl butyral, polyvinyl acetal, polyvinyl alcohol, polyolefin, polyurethane, polystyrene, or a copolymer of these may be mentioned. Particularly, butyrals, such as polyvinyl butyral, are preferable.

The binder is contained in the electrode paste by preferably 8 to 20 parts by weight with respect to 100 parts by weight of the conductive material (metal powder). As a solvent, any of well-known ones, such as terpineol, butylcarbitol and kerosene, may be used. A content of the solvent is preferably 20 to 55 wt % or so with respect to the entire paste.

To improve the adhesiveness, the electrode paste preferably contains a plasticizer. As a plasticizer, benzylbutyl phthalate (BBP) and other phthalate esters, adipic acids, phosphoric esters, and glycols, etc. may be mentioned. The plasticizer in the electrode paste is preferably 10 to 300 parts by weight, and more preferably 10 to 200 parts by weight with respect to 100 parts by weight of the binder. Note that when an adding quantity of the plasticizer or adhesive is too large, it is liable that strength of the electrode layer 12*a* remarkably declines. Also, to improve transferability of the electrode layer 12*a*, it is preferable to improve adhesiveness and/or adherence of the electrode paste by adding a plasticizer and/or adhesive to the electrode paste.

After or before forming the electrode paste layer having a predetermined pattern on the surface of the release layer 22 by a printing method, a blank pattern layer 24 is formed to be substantially the same thickness as that of the electrode layer 12*a* on the surface of the release layer 22 not formed with the electrode layer 12*a*. The blank pattern layer 24 is composed of the same material as that of the green sheet 10*a* shown in FIG. 4 and formed by the same method. The electrode layer 12*a* and the blank pattern layer 24 are dried in accordance with need. The drying temperature is not particularly limited, but is preferably 70 to 120° C., and the drying time is preferably 5 to 15 minutes.

(3) As shown in FIG. 2A, an adhesive layer transfer sheet formed with an adhesive layer 28 is prepared on the surface of a carrier sheet 26 as a third support sheet separately from the carrier sheets 20 and 30 explained above. The carrier sheet 26 is formed by the same sheet as that of the carrier sheets 20 and 30.

A composition of the adhesive layer 28 is the same as that of the release layer 22 except for not containing a release agent. Namely, the adhesive layer 28 contains a binder, a plasticizer and a release agent. The adhesive layer 28 may contain the same dielectric particle as that of the dielectrics composing the green sheet 10a, however, in the case of forming an adhesive layer having a thinner thickness than a particle diameter of the dielectric particles, it is better not to contain dielectric particles. Also, when dielectric particles are contained in the adhesive layer 28, a particle diameter of the dielectric particles is preferably smaller than the particle diameter of the dielectric particles contained in the green sheet.

A plasticizer is preferably contained in the adhesive layer 28 by 0 to 200 parts by weight, preferably 20 to 200 parts by weight, and more preferably 50 to 100 parts by weight with respect to 100 parts by weight of the binder.

The adhesive layer 28 further contains an antistatic agent, and the antistatic agent includes one of imidazoline based surfactants, and a weight based adding quantity of the antistatic agent is preferably not larger than that of the binder (organic polymer material). Namely, the antistatic agent is preferably contained in the adhesive layer 28 by 0 to 200 parts by weight, preferably 20 to 200 parts by weight, and more preferably 50 to 100 parts by weight with respect to 100 parts by weight of the binder.

A thickness of the adhesive layer 28 is preferably 0.02 to 0.3 μm or so, more preferably, thinner than an average particle diameter of dielectric particles contained in the green sheet. Further, a thickness of the adhesive layer 28 is preferably 1/10 or less of a thickness of the green sheet 10a 1 or thinner.

When a thickness of the adhesive layer 28 is too thin, the adhesive force declines, while when too thick, spaces are easily formed inside an element body after sintering depending on the thickness of the adhesive layer, and a capacitance by an amount of the volume tends to decrease remarkably.

The adhesive layer 28 is formed on the surface of the carrier sheet 26 as a third support sheet, for example, by a bar coater method, die coater method, reverse coater method, dip coater method and kiss coater method, etc. and dried in accordance with need. The drying temperature is not particularly limited, but is preferably the room temperature to 80° C., and the drying time is preferably 1 to 5 minutes.

Figure 3:
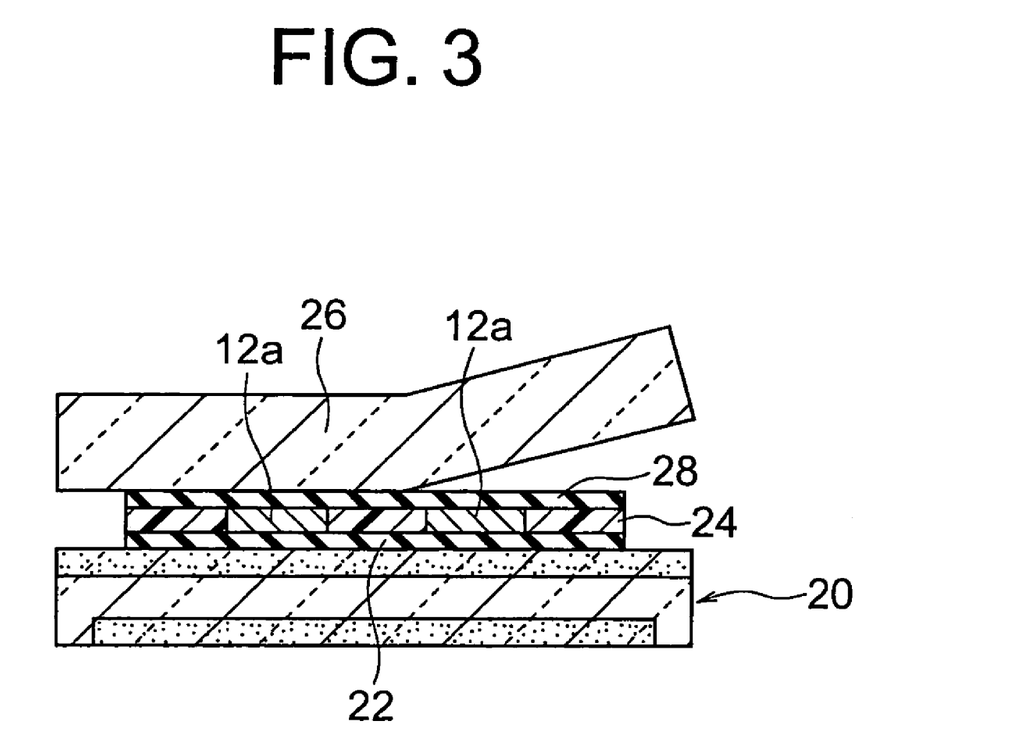
FIG. 3 is a sectional view of a key part showing a continuation step of FIG. 2(A)

(4) To form the adhesive layer on the surface of the electrode layer 12a and the blank pattern layer 24 shown in FIG. 2(A), a transfer method is applied in the present embodiment. Namely, as shown in FIG. 3, the adhesive layer 28 of the carrier sheet 26 is pressed against the surface of the electrode layer 12a and the blank pattern layer 24, heated and pressed, then, the carrier sheet 26 is removed. Consequently, the adhesive layer 28 is transferred to the surface-of the electrode layer 12a and the blank pattern layer 24. Note that transfer of the adhesive layer 28 may be performed on the surface of the green sheet 10a shown in FIG. 4.

The heating temperature at transferring is preferably 40 to 100° C., and the pressing force is preferably 0.2 to 15 MPa. Pressing may be performed by a press or a calendar roll, but is preferably performed by a pair of rolls.

After that, the green sheet 10a formed on the surface of the carrier sheet 30 shown in FIG. 4 is transferred on the electrode layer 12a and the blank pattern layer 24 via the adhesive layer 28. Heating and pressing at the time of transferring may be pressing and heating by a press or by a calendar roll, but is preferably performed by a pair of rolls. The heating temperature and the pressing force are same as those at the time of transferring the adhesive layer 28.

Figure 5:
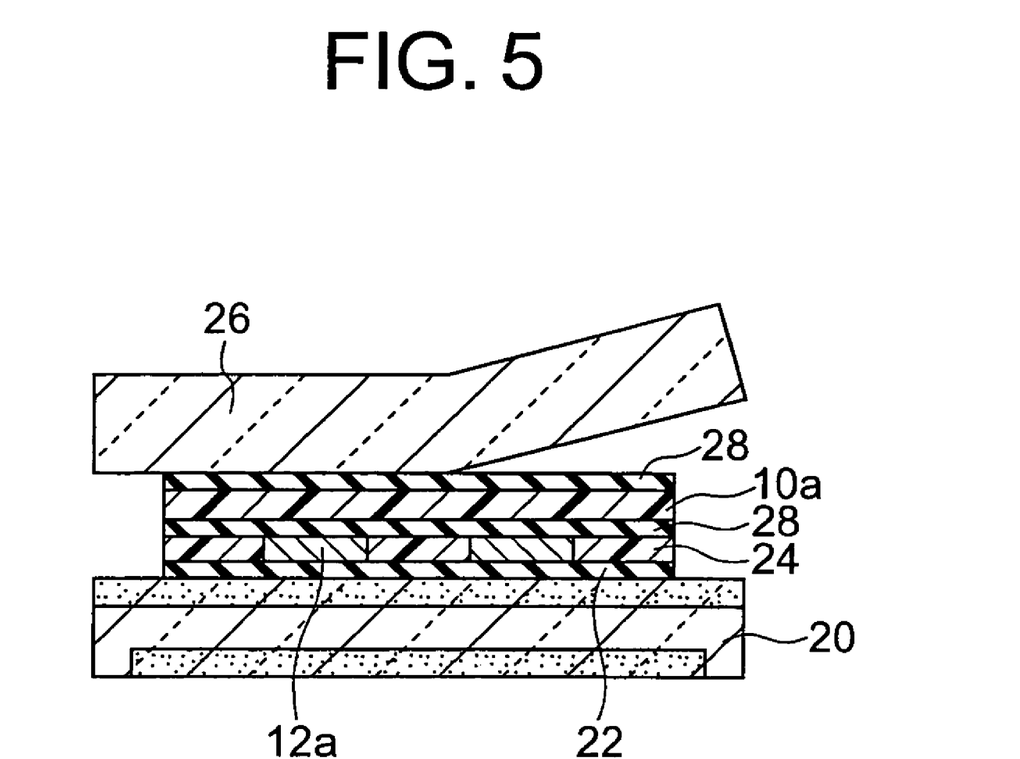
FIG. 5 is a sectional view of a key part showing a continuation step of FIG. 4.
Figure 6:
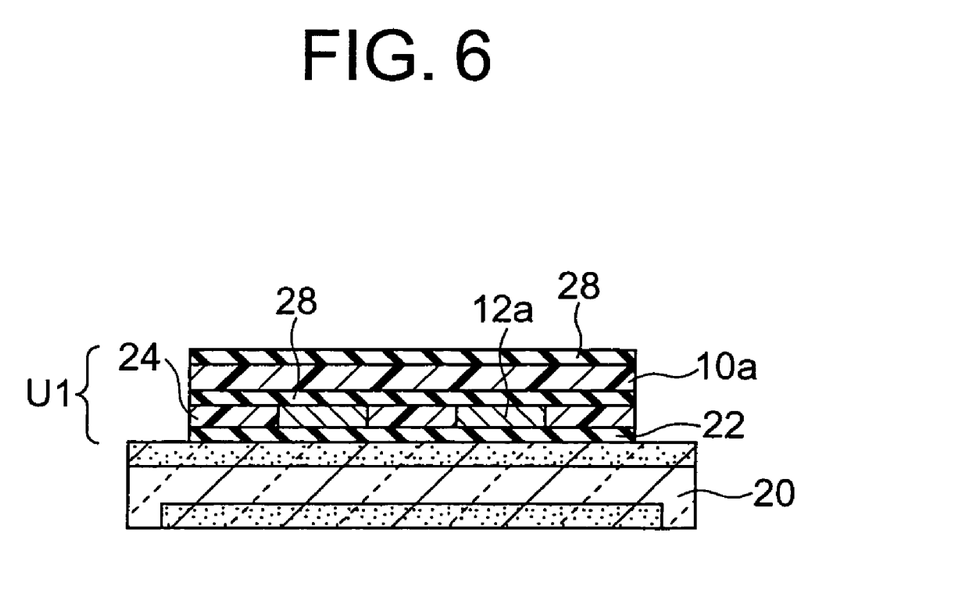
FIG. 6 is a sectional view of a key part showing a continuation step of FIG. 5.

As shown in FIG. 5, the adhesive layer 28 is transferred to the surface of the green sheet 10a. The transfer is the same with that of bond layer 28 as shown in FIG. 3. Next, as shown in FIG. 6, the carrier sheet 20 with multilayer unit wherein a multilayer unit U1 is formed can be obtained by separating the support sheet 26. The multilayer unit U1 is a 5 layered multilayer structure comprising bond layer on the outer surface of the unit and green sheet 10a and electrode layer 12a inside the unit.

Figure 7:
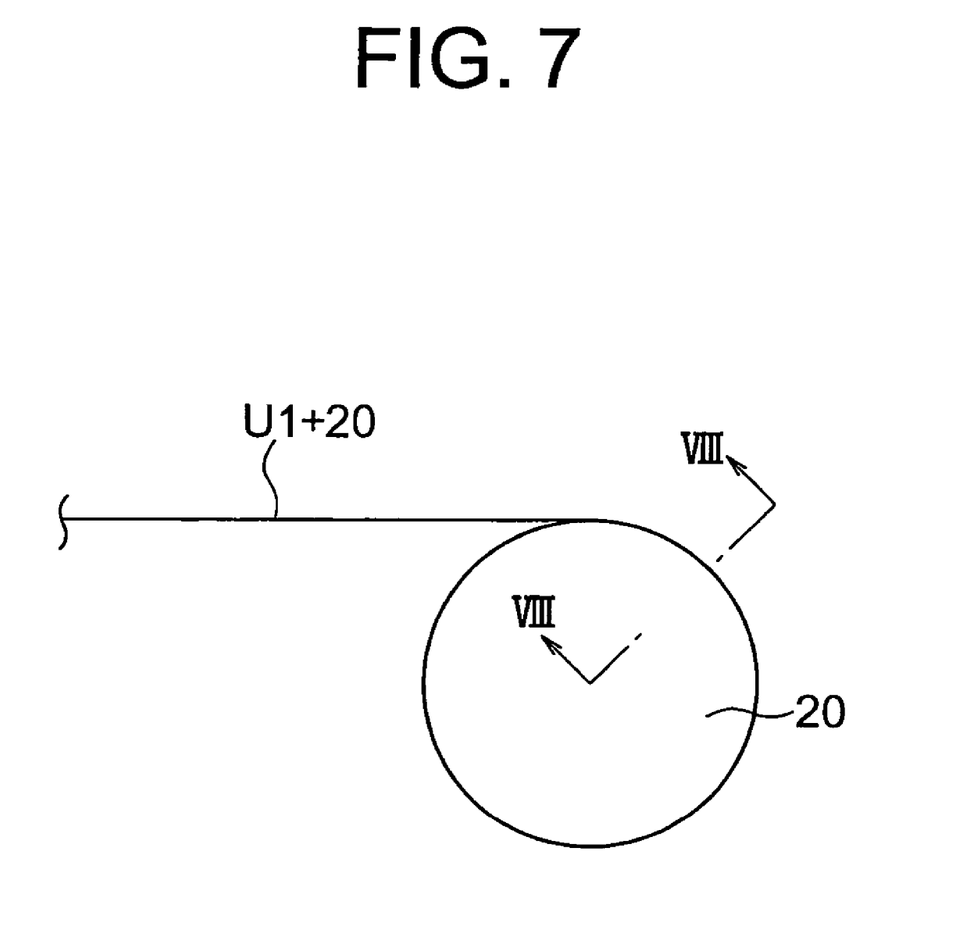
FIG. 7 is a schematic view showing a rolling up step of a support sheet with multilayer unit as in FIG. 6.

Carrier sheet 20 where multilayer unit U1 is formed on the surface becomes roll body R as shown in FIG. 7. Said roll body R is easy to convey and store. Carrier sheet 20 with multilayer unit, which is rolled by the roll body R is stacked as shown in FIG. 8.

Figure 8:
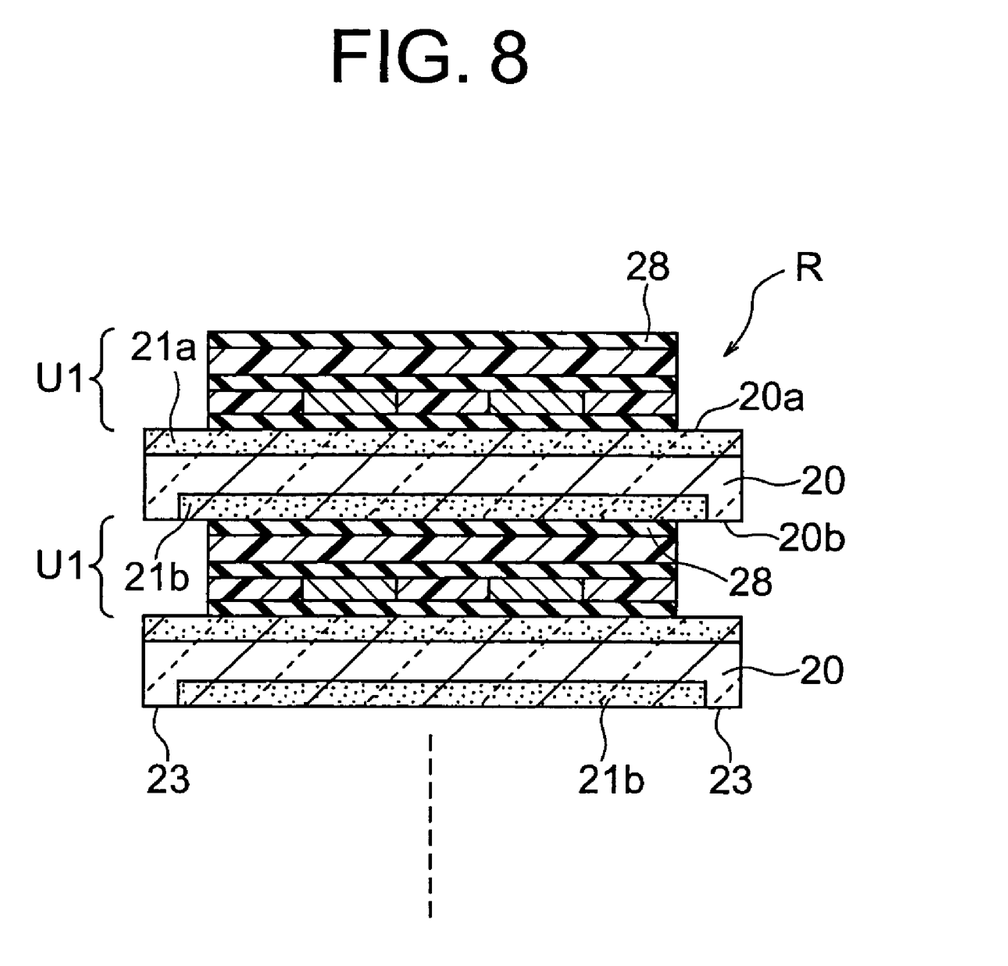
FIG. 8 is a sectional view of a key part showing a stacking state of support sheet after rolled.

Namely, as shown in FIG. 8, a bond layer 28, placed at the top of multilayer unit U1 which is formed on a surface of carrier sheet 20, contacts a partial treatment part 21b, which is formed on a back surface 20b of carrier sheet 20 located at the top of said bond layer 28, and does not contact adhesive part 23. A partial treatment part 21b is a part where separation-facilitating surface treatment is provided and does not bond to a bond layer 28 even when they are in contact.

As shown in FIG. 7, carrier sheet 20 with multilayer unit can easily be unrolled from the roll R. Moreover, even when carrier sheet 20 with multilayer unit is unrolled, a part of multilayer unit U1 including bond layer 28 will not be adhesive to back surface of the carrier sheet 20.

Figure 9:
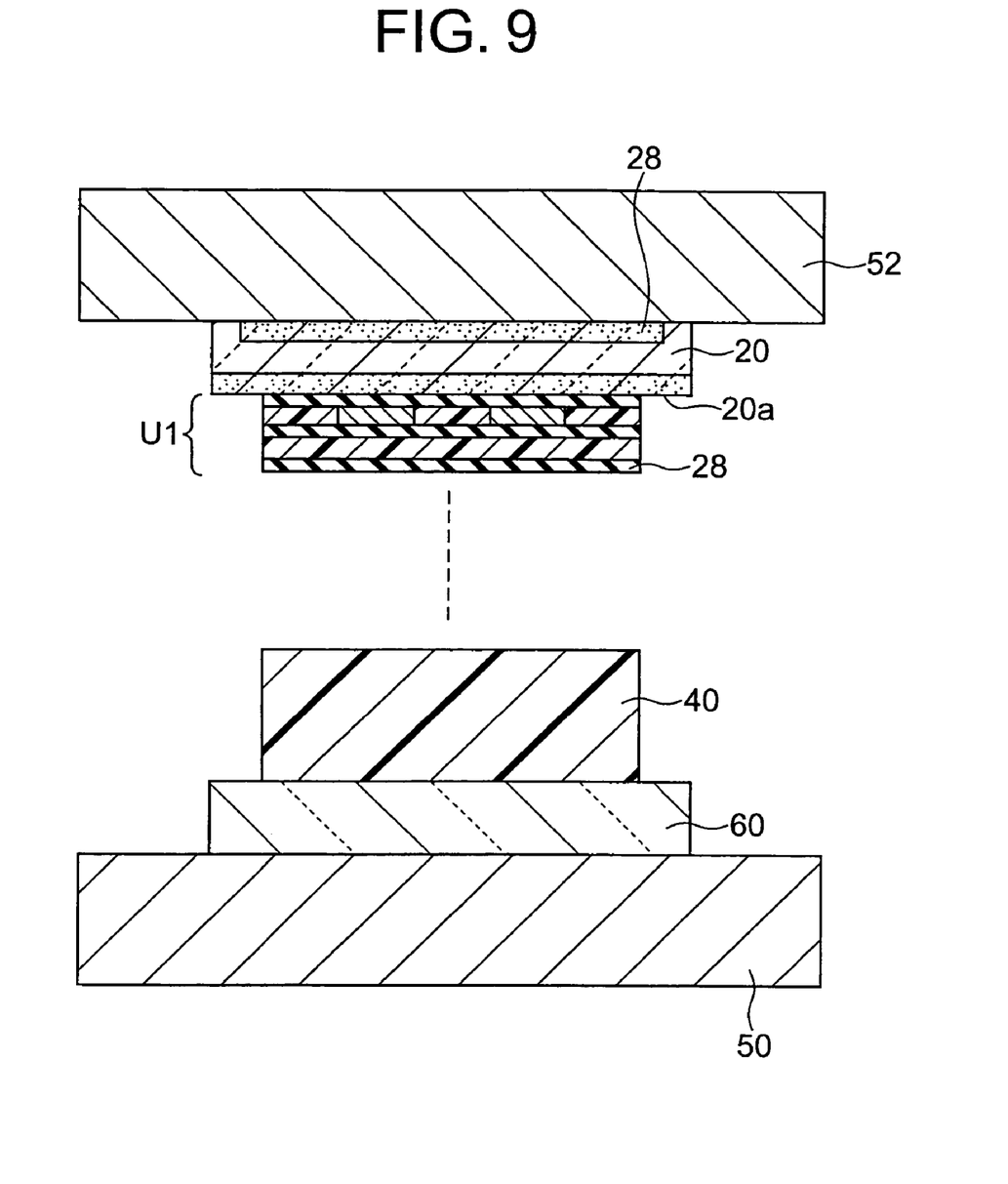
FIG. 9 is a schematic view showing a stacking method of a multilayer unit.

(5) After the conveyance or the storage of the roll R, carrier sheet 20 with multilayer unit was unrolled and if necessary, the sheet 20 was cut in the required length and stacks the multilayer unit U1 by transferring. Concretely, first, as shown in FIG. 9, carrier sheet on which an exterior green sheet (a thick multilayer wherein a plural number of green sheet without forming an electrode is fixed) 40 is formed is fixed on lower configuration 50. Then, multilayer units U1 are respectively stacked on exterior green sheet 40.

When stacking the multilayer unit U1, a back surface 20b of carrier sheet 20 forming multilayer unit U1 on its surface is made to face upward, and bond layer 28 of multilayer unit U1 is pressed against upper surface of green sheet 40. In order to add pressure to carrier sheet 20, upper configuration 52 can be used and the upper configuration 52 can be pressed against lower configuration 50 by contacting back surface 20b of the carrier sheet 20.

Figure 10:
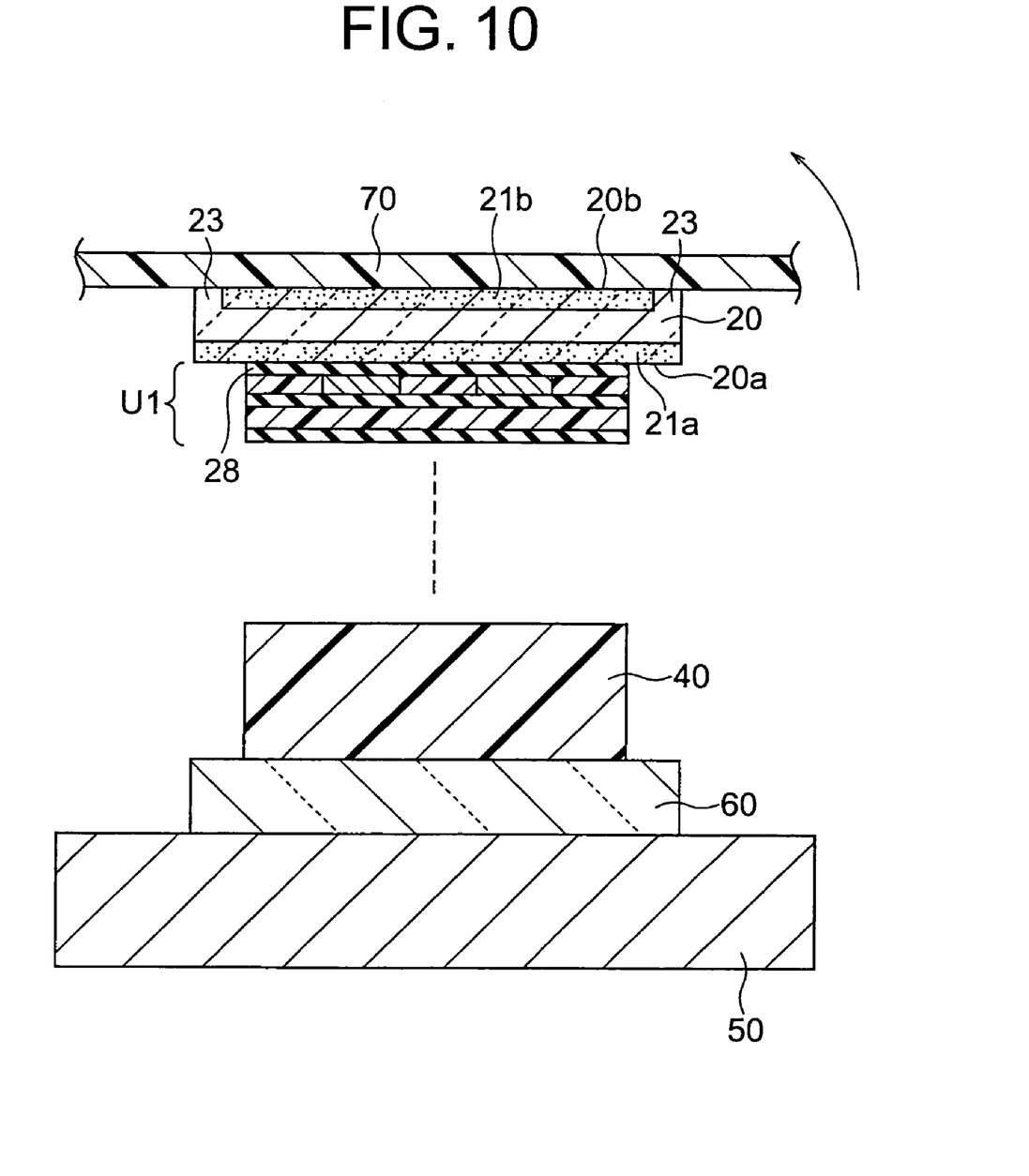
FIG. 10 is a schematic view showing a continuation step of FIG. 9.

Then, as shown in FIG. 10, upper configuration 52 can be released and adhesive tape (adhesive sheet) 70 sticks to back surface 20b of carrier sheet 20, which is to help separating. On the back surface 20b of carrier sheet 20, adhesive part 23 where a separation-facilitating surface treatment is not provided exists and adhesive tape 70 conveniently sticks to back surface of carrier sheet 20.

Figure 11:
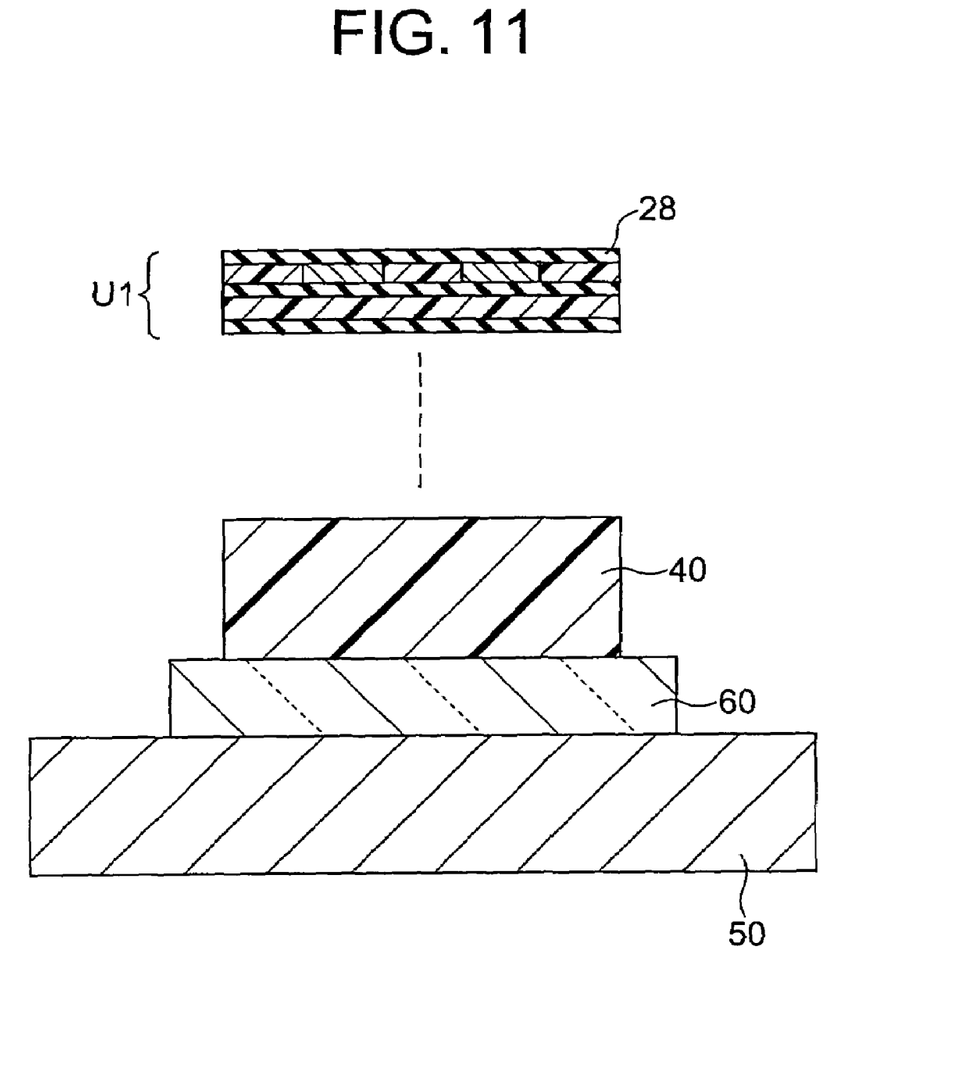
FIG. 11 is a schematic view showing a continuation step of FIG. 10.

Then, by turning adhesive tape 70 over to upper side, carrier sheet 20 will also be turned up together with the adhesive tape 70, and as shown in FIG. 11, the carrier sheet 20 will be released from the multilayer unit U1. By repeating the abovementioned steps as shown in FIGS. 9 to 11, a plural number of multilayer units U1 can be stacked on the exterior green sheet 40. Stacking a plural number of multilayer units U1, forming green sheets 10a and electrode layers 12a with a required number of layers, exterior green sheet 40 is stacked on the top, then, the final pressing is done.

Pressure at the time of the final pressing is preferably 10 to 200 MPa. The heating temperature is preferably 40 to 100° C. After that, the multilayer body is cut to be a predetermined size to form green chips. The green chips are subjected to binder removal process and firing process, then, thermal treatment is performed in order to re-oxidize the dielectric layer.

The binder removal processing may be performed under a normal condition, but when using a base metal, such as Ni and a Ni alloy as a conductive material of the internal electrode layer, it is preferably performed under the specific condition below.

temperature rising rate: 5 to 300° C./hour, particularly 10 to 50° C./hour     holding temperature: 200 to 400° C., particularly 250 to 350° C.

holding time: 0.5 to 20 hours, particularly 1 to 10 hours     atmosphere: a wet mixed gas of $N_2$ and $H_2$ A firing condition is preferably as below.

temperature rising rate: 50 to 500° C./hour, particularly 200 to 300° C./hour     holding temperature: 1100 to 1300° C., particularly 1150 to 1250° C.

holding time: 0.5 to 8 hours, particularly 1 to 3 hours cooling rate: 50 to 500° C./hour, particularly 200 to 300° C./hour     atmosphere gas: a wet mixed gas of $N_2$ and $H_2$, etc.

Note that oxygen partial pressure in an atmosphere in the air at firing is preferably $10^{-2}$ Pa or lower, particularly $10^{-2}$ to $10^{-8}$ Pa. When exceeding the above ranges, the internal electrode layer tends to oxidize, while when the oxygen partial pressure is too low, abnormal sintering is caused in an electrode material of the internal electrode layer to be broken.

The thermal treatment after performing such firing is preferably performed with a holding temperature or highest temperature of 1000° C. or higher, more preferably 1000 to 1100° C. When the holding temperature or the highest temperature at the time of the thermal treatment is lower than the above ranges, it is liable that oxidization of the dielectric material is insufficient to make the insulation resistance lifetime short, while when exceeding the above ranges, Ni in the internal electrode oxidizes and the capacity decreases, moreover, Ni reacts with a dielectric base and the lifetime also tends to become short. The oxygen partial pressure at the time of thermal treatment is higher than that in-a reducing atmosphere at the time of firing, preferably $10^{-3}$ Pa to 1 Pa, and more preferably $10^{-2}$ Pa to 1 Pa. When it is lower than the above range, re-oxidization of the dielectric layer 2 becomes difficult, while when exceeding the above ranges, the internal electrode layer 3 tends to oxidize. Other condition of the thermal treatment is preferably as below.

holding time: 0 to 6 hours, particularly 2 to 5 hours cooling rate: 50 to 500° C./hour, particularly 100 to 300° C./hour     atmosphere gas: wet $N_2$ gas, etc.

Note that to wet a $N_2$ gas or a mixed gas, etc., for example, a wetter, etc. may be used. In this case, the water temperature is preferably 0 to 75° C. or so. Also, the binder removal processing, firing and thermal treatment may be performed continuously or separately. When performing continuously, the atmosphere is changed without cooling after the binder removal processing, continuously, the temperature is raised to the holding temperature at firing to perform firing. Next, it is cooled and the thermal treatment is preferably performed by changing the atmosphere when the temperature reaches to the holding temperature of the thermal treatment. On the other hand, when performing them separately, after raising the temperature to the holding temperature at the binder removal processing in an atmosphere of a $N_2$ gas or a wet $N_2$ gas, the atmosphere is changed, and the temperature is furthermore raised. After that, after cooling the temperature to the holding temperature at the thermal treatment, it is preferable that the cooling continues by changing the atmosphere again to a $N_2$ gas or a wet $N_2$ gas. Also, in the thermal treatment, after raising the temperature to the holding temperature under the $N_2$ gas atmosphere, the atmosphere may be changed, or the entire process of the thermal processing may be in a wet $N_2$ gas atmosphere.

The thus obtained sintered body (element body 4) is subjected to end surface polishing, for example, by barrel polishing and sand-blast, etc., then, a terminal electrode paste is burnt to form terminal electrodes 6 and 8. For example, a firing condition of the terminal electrode paste is preferably in a wet mixed gas of $N_2$ and $H_2$ at 600 to 800° C. for 10 minutes to 1 hour or so. In accordance with need, plating, etc. is performed on the terminal electrodes 6 and 8 to form a pad layer. Note that the terminal electrode paste may-be fabricated in the same way as the electrode paste explained above.

A multilayer ceramic capacitor of the present invention produced as above is mounted on a print substrate, etc. by soldering, etc. and used for a variety of electronic equipments, etc.

In a method of manufacturing a multilayer ceramic capacitor according to the present embodiment, it is possible to easily transfer a dry type electrode layer 12a to a surface of the green sheet 10a with high accuracy without breaking or deforming the green sheet 10a.

Particularly, in the manufacturing method of the present embodiment, the adhesive layer 28 is formed on the surface of the electrode layer or green sheet by the transfer method, and the electrode layer 12a is bonded with the surface of the green sheet 10a via the adhesive layer 28. By forming the adhesive layer 28, a high pressure and heat become unnecessary at the time of bonding the electrode layer 12a to transfer to the surface of the green sheet 10a, so that bonding at a lower pressure and lower temperature becomes possible. Accordingly, even in the case of an extremely thin green sheet 10a, the green sheet 10 a is not-broken, the electrode layers 12a and green sheets 10a can be preferably stacked, and short-circuiting defect, etc. are not caused.

Furthermore, in the present embodiment, the adhesive layer 28 is not directly formed on a surface of the electrode layer 12a or green sheet 10a by a coating method, etc. and formed by a transfer method, so that components of the adhesive layer 28 do not soak in the electrode layer 12a or green sheet 10a, and it becomes possible to form an extremely thin adhesive layer 28. For example, a thickness of the adhesive layer 28 can be made thin as 0.02 to 0.3 μm or so. Although the thickness of the adhesive layer 28 is thin, components of the adhesive layer 28 do not soak in the electrode layer 12a and green sheet 10a, the adhesive force is sufficient and a composition of the electrode layer 12a or green sheet 10a is not adversely affected.

Particularly, according to the present embodiment, due to adhesive parts 23 existing at back surface 20b of carrier sheet 20 as support sheet, a device to help separating such as adhesive tape (adhesive sheet) 70 can easily be fitted to the back surface 20b as shown in FIG. 10. Accordingly, when separating carrier sheet 20 from multilayer unit U1, adhesive tape 70 is stuck to the back surface 20b of carrier sheet 20 and the carrier sheet 20 can easily be separated, and an attempt to efficiently stack (including the transferring and bonding) the multilayer unit U1 can be made.

Further, according to the present embodiment, on the back surface 20b of carrier sheet 20, as shown in FIG. 8, a separation-facilitating surface with a width equal to or greater than the width of the multilayer unit U1 is provided. Accordingly, when rolling up the carrier sheet 20 with multilayer unit, and even when forming a roll body R, bond layer 28 which is a surface of multilayer unit U1, does not stick to back surface 20b of carrier sheet 20. Accordingly, when unrolling the roll body R, inconveniences such as lacking the outer surface layer of multilayer unit U1 do not occur. Therefore, multilayer unit U1 can be well stacked (including transferring and bonding) and contribute to making green sheets and/or electrode layers thin and increasing a number of the stacking dielectric layer and/or internal electrode layer.

Note that the present invention is not limited to the above embodiments and may be variously modified within the scope of the present invention.

For instance, a method of the present invention is not limited to a manufacturing method of multilayer ceramic capacitor, but can be applied to manufacturing method of the other multilayer electronic devices.

Further, according to the embodiment mentioned above, as shown in FIGS. 6 and 7, multilayer unit U1 formed on the surface of carrier sheet 20 comprises 5 layers, however, in the invention, said multilayer unit U1 is not limited to the 5 layers and can be any number of layers. Further, multilayer unit U1 formed on the surface of carrier sheet 20, may be a single layer of green sheet 10a, a single layer of inner electrode 12a, a single layer of bond layer 28, or combinations thereof.

As described above, according to the present invention, when rolling up the support sheet, where multilayer unit comprising green sheet and/or electrode is formed, the multilayer unit does not stick to a back surface of the carrier sheet and can easily be unrolled. Moreover, when stacking multilayer unit, support sheet can easily separated from multilayer unit.

What is claimed is:

1. A stacking method of green sheet comprising the steps of;
    forming a support sheet with multilayer units by stacking the multilayer unit that comprises electrode layer and/or green sheet on a surface of the support sheet,
    forming a roll body by rolling up the support sheet with the multilayer unit, and
    stacking the multilayer units by unrolling the roll body, placing the support sheet with multilayer unit on a layer which the support sheet is to be placed, and separating the support sheet from the multilayer unit,
    wherein,
    a separation-facilitating surface treatment with a width equal to or greater than the width of the multilayer unit is formed on the back surface of the support sheet and an adhesive part where the separation-facilitating surface treatment is not provided is also formed.

2. The stacking method of green sheet as set forth in claim 1, wherein the adhesive part is successively or intermittently formed along a longitudinal direction of the support sheet on the back surface of said support sheet.

3. The stacking method of green sheet as set forth in claim 1, wherein a part where the separation-facilitating surface treatment is provided is successively formed along a longitudinal direction of the support sheet on the back surface of said support sheet.

4. The stacking method of green sheet as set forth in claim 1, wherein the adhesive parts are formed on the back surface of support sheet on one side or both sides of a width direction of said support sheet.

5. The stacking method of green sheet as set forth in claim 1, wherein on a surface of the support sheet, the separation-facilitating surface treatment, having a width equal to or greater than a width of the separation-facilitating surface treatment provided on the back surface of the support sheet.

6. The stacking method of green sheet as set forth in claim 1, wherein bond layer is stacked on a surface of the multilayer unit.

7. The stacking method of green sheet as set forth in claim 1, wherein an adhesive sheet is adhered to a back surface of support sheet, and by using said adhesive sheet, said support sheet is separated from the multilayer unit.

8. The stacking method of green sheet as set forth in claim 1, wherein the roll body is unrolled, the support sheet with multilayer unit is cut, the cut support sheet with multilayer unit is placed on a layer where it is to be stacked, the support sheet is separated from the multilayer unit, and the multilayer unit is stacked.

9. The stacking method of green sheet as set forth in claim 1, wherein the multilayer unit comprises an electrode layer having a predetermined pattern and a blank pattern layer formed in a blank part between the electrode layers having a predetermined pattern.

10. A method of manufacturing a multilayer ceramic electronic device, comprising the steps of providing removing binder treatment and firing a multilayer body which is stacked by green sheet stacking method as set forth in claim 1.

* * * * *